US006384516B1

(12) United States Patent
Fraser

(10) Patent No.: US 6,384,516 B1
(45) Date of Patent: May 7, 2002

(54) HEX PACKED TWO DIMENSIONAL ULTRASONIC TRANSDUCER ARRAYS

(75) Inventor: John Douglas Fraser, Woodinville, WA (US)

(73) Assignee: ATL Ultrasound, Inc., Bothell, WA (US)

( * ) Notice: Subject to any disclaimer, the term of this patent is extended or adjusted under 35 U.S.C. 154(b) by 0 days.

(21) Appl. No.: 09/488,583

(22) Filed: Jan. 21, 2000

(51) Int. Cl.[7] .......................... H04R 17/00; H01L 41/08
(52) U.S. Cl. ........................................................ 310/334
(58) Field of Search .................................. 310/334, 322

(56) References Cited

U.S. PATENT DOCUMENTS

| | | | | | |
|---|---|---|---|---|---|
| 3,362,501 | A | * | 1/1968 | Lenahan | 310/334 |
| 4,398,325 | A | | 8/1983 | Paiget et al. | 29/25.35 |
| 4,671,293 | A | * | 6/1987 | Shaulov | 310/334 |
| 4,694,434 | A | | 9/1987 | von Ramm et al. | 367/7 |
| 4,949,310 | A | | 8/1990 | Smith et al. | 367/7 |
| 5,065,068 | A | | 11/1991 | Oakley | 310/357 |
| 5,164,920 | A | | 11/1992 | Bast et al. | 367/140 |
| 5,295,487 | A | * | 3/1994 | Saitoh et al. | 128/662.03 |
| 5,311,095 | A | | 5/1994 | Smith et al. | 310/334 |
| 5,329,496 | A | | 7/1994 | Smith | 367/140 |
| 5,522,393 | A | | 6/1996 | Phillips et al. | 128/661.09 |
| 5,539,965 | A | | 7/1996 | Safari et al. | 29/25.35 |
| 5,546,807 | A | | 8/1996 | Oxaal et al. | 73/606 |
| 5,548,564 | A | | 8/1996 | Smith | 367/140 |
| 5,625,149 | A | | 4/1997 | Gururaja et al. | 73/632 |
| 5,742,060 | A | | 4/1998 | Ashburn | 250/370.09 |
| 5,744,898 | A | * | 4/1998 | Smith et al. | 310/334 |
| 5,796,207 | A | | 8/1998 | Safari et al. | 310/358 |
| 5,898,793 | A | | 4/1999 | Karron et al. | 382/131 |
| 5,938,612 | A | | 8/1999 | Kline-Schoder et al. | 600/459 |
| 6,014,897 | A | | 1/2000 | Mo | 73/628 |
| 6,104,126 | A | * | 8/2000 | Gilmore | 310/334 |

FOREIGN PATENT DOCUMENTS

EP 0 697 257 A2 2/1996

OTHER PUBLICATIONS

Fatemi et al., "Application of Hexagonal Arrays in Generation and Steering of Limited Diffraction Beams," pp. 1531–1534, 1994 IEEE Ultrasonic Symposium.

Fatemi, M. et al., "Efficient Generation of Limited Diffraction Beams by Hexagonal Arrays," Biomedical Engineering Dept., Amirkabir University, Tehran, Iran, Ultrasonic Imaging, vol. 16, No. 1, Jan. 1994, p. 53.

Fatemi, M., et al., "Application of Hexagonal Arrays in Generation and Steering of Limited Difraction Beams," IEEE, 1994 Ultrasonic Symposium, pp. 1531–1534 Dec. 1994.

Mills et al., "Combining Multi–Layers and Composites to Increase SNR for Medical Ultrasound Transducers," at pp. 1509–1512, IEEE Ultrasonics Symposium Jan. 1996.

* cited by examiner

*Primary Examiner*—Thomas M. Dougherty
(74) *Attorney, Agent, or Firm*—W. Brinton Yorks, Jr.

(57) ABSTRACT

A two dimensional ultrasonic transducer array suitable for three dimensional phased array scanning is formed of hexagonally close packed transducer elements. In a preferred embodiment the transducer elements have a rectilinear shape, allowing the array to be fabricated with conventional dicing saw processes.

25 Claims, 8 Drawing Sheets

HEX PACKED TWO DIMENSIONAL ULTRASONIC TRANSDUCER ARRAYS

This invention relates to transducers for ultrasonic diagnostic imaging systems and, in particular, to two-dimensional ultrasonic transducer arrays.

Transducer arrays are presently in widespread use in ultrasonic diagnostic imaging. Compared to single element (single piston) transducers, array transducers permit the beam transmitted and received by the elements of the array to be electronically steered and focused. Beamformers which perform steering and focusing: of both transmit and receive beams of transducer arrays are commonly available.

The transducer array which is most prevalent is one comprising a single row of transducer elements. Such transducer arrays are known as one-dimensional or 1D arrays, and are operable as linear, curved linear, and phased array transducers. The 1D array transducer is so named because it comprises a single line or row of transducer elements and is able to steer and focus the beam in only one dimension, the image plane which is aligned with the longitudinal dimension of the array row. The beam can be steered over a wide range of directions in this image plane. Such transducers are well suited for scanning an image plane for the two-dimensional imaging of a plane or "slice" of the body.

Transducer arrays may also be formed of multiple rows of transducer elements, one form of which is the 1.5D transducer array. In a 1.5D transducer array, additional rows of transducer elements are located symmetrically on either side of a central row of elements or about the longitudinal center of the array. Rows of elements which are symmetrically located on either side of the longitudinal center are operated together, enabling the transducer to be electronically focused in the elevation dimension orthogonal to the longitudinal dimension. This means that the 1D transducer array can produce a two dimensional image which is "thin" in the elevational (slice thickness) dimension.

When a transducer array is formed of multiple elements in two dimensions without the restriction of symmetrical operation in the elevation dimension, the ultrasonic beams can be both electronically steered and focused over 360° of azimuth and 180° of inclination. This enables the transducer array to scan beams over a three dimensional volume, thereby providing fully electronic scanning for three dimensional (3D) ultrasonic imaging. Fully electronic scanning is desirable both for reliability and to obtain the beam scanning necessary for real time 3D imaging.

When a 2D array transducer scans in any direction in a 3D volume, it is desirable that certain criteria which provide for high image quality be met for all beam scanning orientations. For instance the antenna pattern of the beam should prevent deleterious grating lobes, which can contribute clutter to the received ultrasound signals. A desirable criterion for grating lobes in a 2D array is that the pitch of the array, the maximum center-to-center spacing of nearest neighbor rows of transducer elements in any direction, be no greater than approximately one-half wavelength ($\lambda/2$), where $\lambda$ is generally taken to be the wavelength of a reference or center frequency of the transducer. An array with a pitch in excess of this criterion can contribute a relatively high degree of unwanted clutter to the desired image information. For a 1D array the pitch is the distance from one element to the next, but for 2D arrays adjacent elements extend in two dimensions which must be considered.

A 2D array for 3D imaging should also be capable of being manufactured in significant quantities at relatively low cost. If the 2D array can only be manufactured by exotic and expensive processes, its cost will be excessive. A 2D array of the desired performance criteria which can be manufactured using standard 1D transducer array processes is highly desirable.

In accordance with the principles of the present invention, a two dimensional ultrasonic transducer array is formed of a plurality of transducer elements which are closely packed in a hexagonal grid pattern. The close packing in the hexagonal grid affords an optimally small pitch for good grating lobe performance. In one embodiment rectilinear transducer elements are arranged in staggered rows to form the hexagonal pattern, which allows the array to be manufactured using conventional fabrication techniques. In another embodiment the array elements are composite elements, affording further ease in manufacturing. Preferably the composite elements are operated in the $k_{31}$ mode, which affords a further ease in making electrical connections to the array elements.

In the drawings:

FIG. 1 is a plan view of an array of hexagonal transducer elements arranged in a 2D hexagonal array;

FIG. 1*a* is a side view of a typical transducer element of an array stack;

FIG. 1*b* illustrates the pitch analysis of a conventional rectilinear 2D array;

FIG. 1*c* illustrates the pitch analysis of a hex packed array;

FIG. 2 is a plan view of rectilinear transducer elements arranged in a 2D hexagonal array;

FIG. 3*a* illustrates a subdiced transducer element in perspective;

FIG. 3*b* illustrates a subdiced $k_{31}$ operated transducer array element in perspective;

FIG. 3*c* illustrates a portion of a 2D array of subdiced composite transducer array elements in perspective;

Figure 1:
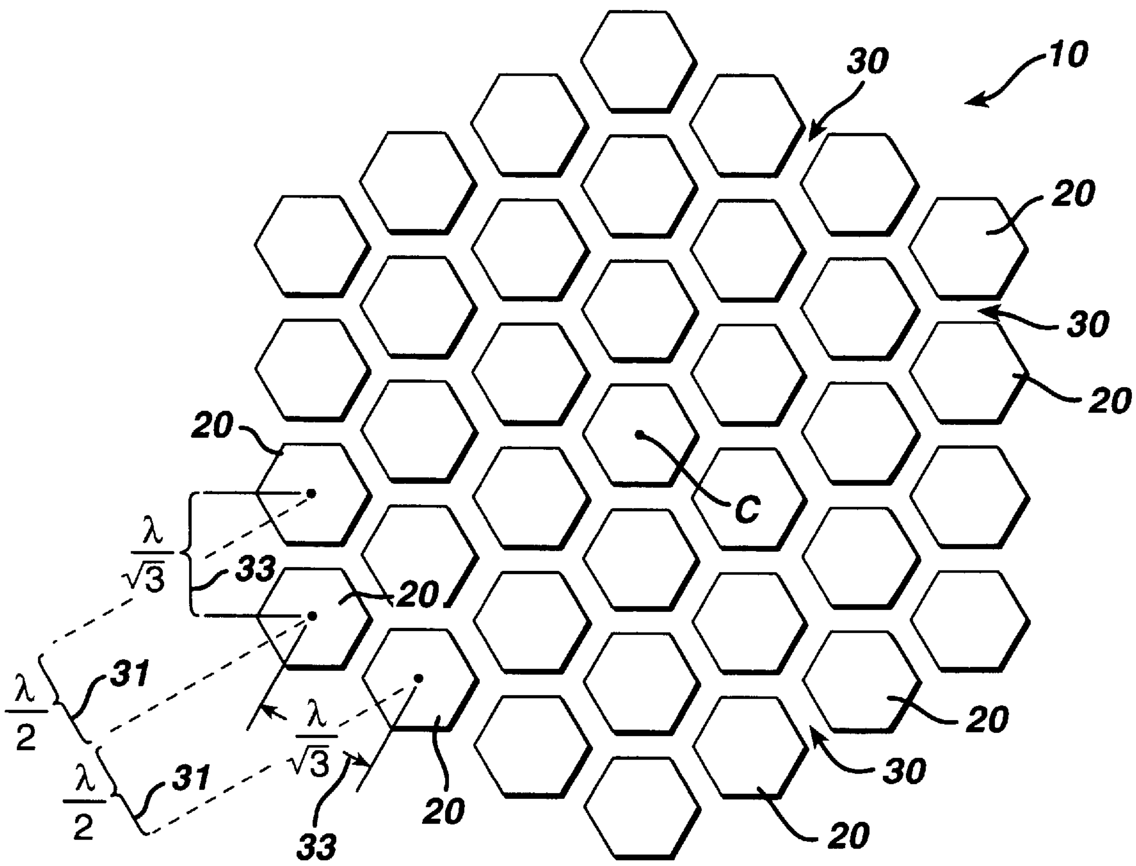
Figure 1A:
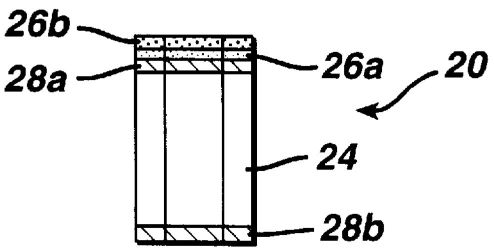

Referring first to FIG. 1, a 2D array 10 of transducer elements 20 is shown in a plan view of the top (transmitting surface) of the array elements. The elements are formed of a piezoelectric material such as PZT. The sides of the elements are cut in a hexagonal shape, which permits them to be closely packed, and therefore the array will exhibit a relatively tight element-to-element spacing (pitch). The elements of the array 10 are cut from a monolithic stack which is fabricated to comprise all of the layers of a transducer which are common to all elements. One element 20 cut from the stack is shown in FIG. 1*a*, which comprises a piezoelectric element 24, two quarter-wave matching layers 26*a* and 26*b*, and two energizing electrodes 28*a* and 28*b*. The array is mounted on a backing of sound attenuating material (not shown) located below the electrode 28*b*.

In operation the array 10 can be used to scan ultrasonic beams into a volumetric region of the body which is in contact with the sound emitting surface of the array. With the energizing electrodes 28*b* of the elements 20 being electrically separate from each other and the elements being acoustically isolated by the interelement spaces 30 (which may be air-filled or filled with an acoustically insulating material to physically stabilize the array), the elements may be individually actuated by timed electrical excitation to transmit a steered and focused beam into the body. The beam may be steered out from the array 10 (toward the viewer of FIG. 1) over a wide range of inclination angles relative to the emitting surface of the array. Since the array is two dimensional the beam can also be steered in any angle in azimuth about its point of origin on the array. Preferably the beam is referenced to a central axis C extending outward (toward the viewer) from the central element of the array. Beams extending from an origin where axis C intersects the central array element will scan a conical or pyramidal volume. Beams extending outward from a plurality of points along the emitting surface of the array can scan a truncated conical or pyramidal volume.

When the array 10 transmits and receives a beam in a given direction, ideally the antenna pattern of the array should exhibit a single lobe of response around the beam direction. However, the finite extent of the array and the tolerances to which the array elements are fabricated cause actual lobe patterns to fall short of this ideal. The antenna pattern can exhibit lobes of lesser response in surrounding directions which will contribute clutter responses from substances at locations other than that of the desired beam direction. The major type of undesired response is grating lobes. Grating lobes may be minimized by controlling the pitch of the array, since the angles of grating lobes relative to the main lobe are inversely related to the pitch. A design criterion which provides acceptable grating lobe performance is to maintain a pitch which is fine enough so that the longest distance between adjacent rows of transducer elements in any direction is no greater than approximately one half wavelength of the ultrasonic frequency of operation, $\lambda/2$. When this criterion is exactly met, the grating lobes at that wavelength (frequency) will be oriented 180° away from the transmit beam direction, and hence will not contribute significant clutter as the transmit beam is steered over a wide range of angles of inclination relative to the array surface.

In the case of a one dimensional (1D) array, the analysis of the pitch characteristic is straightforward. Since the array is one dimensional, it can transmit beams only in a plane extending outward from a line connecting the center points of the single row of transducer elements. Since the beams can be steered only in this plane, the only pitch of consequence is that between adjacent transducer elements in the array. By using a center-to-center spacing which is approximately $\lambda/2$ or less, the 1D array will exhibit an acceptable grating lobe characteristic.

The pitch analysis becomes more complex for a 2D array, for beams are no longer constrained to a single plane extending outward from the array. A 2D array can transmit and receive beams along any plane extending outward from the array. Beams can be transmitted over a full 360° of azimuth from a point of origin on the array and over a wide range of angles of inclination relative to the array surface. This means that the pitch analysis must consider the spacing of element row centers in every direction of azimuth from a given point on a 2D array, and not just along a single row.

Figure 1B:
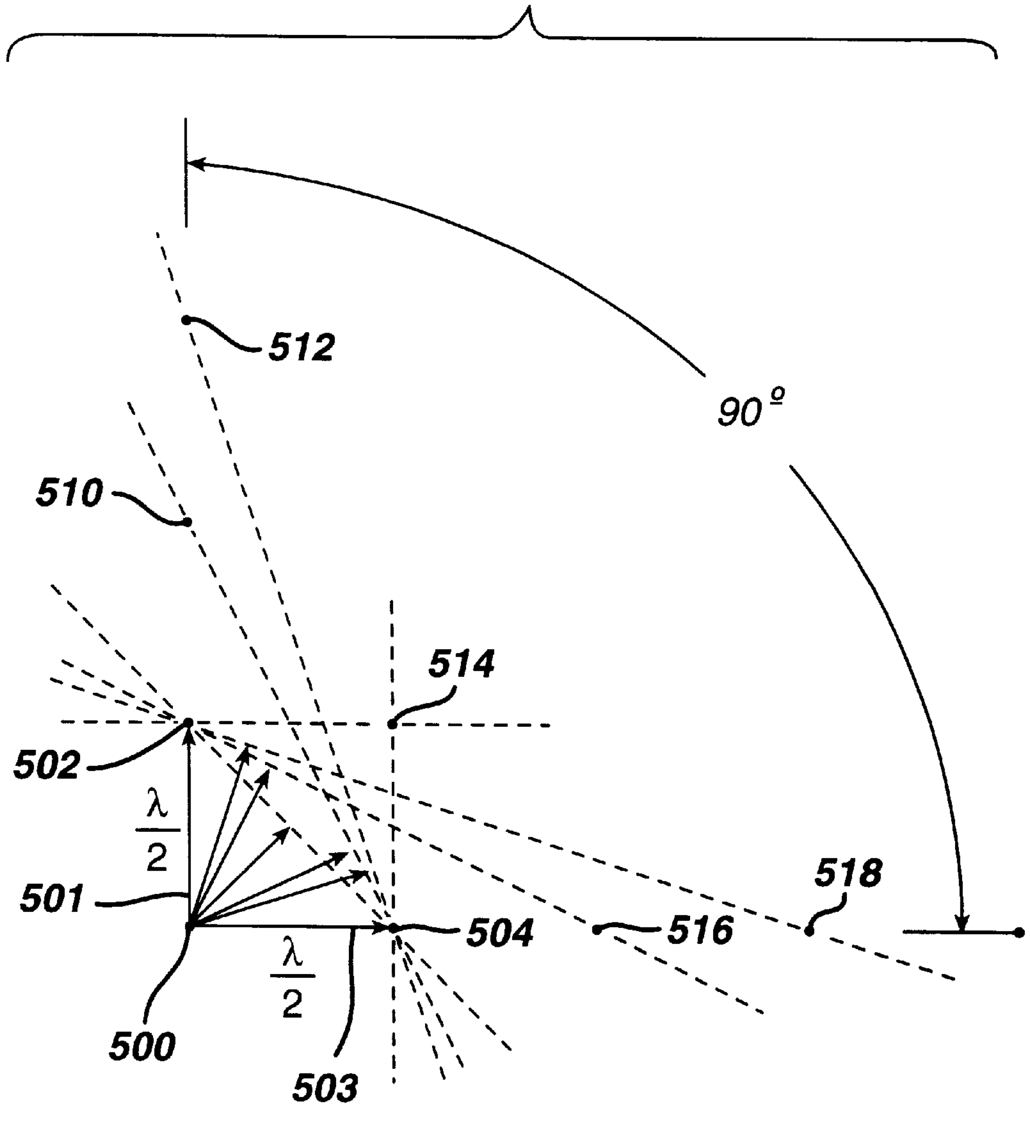

The pitch analysis for a rectilinear 2D array is shown in FIG. 1*b*. The dots shown in the drawing represent the centers of transducer elements arranged in a conventional rectilinear pattern of uniformly spaced rows and columns of transducer elements. The pitch analysis is shown for a reference element center 500 and is performed over a 90° arc of azimuth from the element 500, since the same characteristic is repeated for each 90° quadrant of beam steering. The analysis is performed by drawing dashed lines between the two nearest neighbor element centers 502, 504 and other elements which, together with one of the neighbor elements, form a row of elements, such as 510, 512, 514, 516, 518. Vectors are then drawn from the reference element center 500 normal to each of these dashed row lines. The vectors then represent the pitch between the element 500 and the row of elements delineated by the dashed lines. The longest vector designates the greatest row-to-row spacing and hence the maximum pitch of the array. In FIG. 1*b* it is seen that the smallest pitch is that between element 500 and the row of elements which includes elements 502 and 504. This vector is in a 45° azimuth direction. The vectors on either side of this azimuth direction are seen to progressively increase, reaching a maximum at the orthogonal 0° and 90° directions of vectors 501 and 503. These vectors indicate the longest pitch of the array. The longest pitch identifies the grating lobe at the smallest angle from the main lobe of the array's antenna pattern, since there is an inverse relationship between pitch and grating lobe angle. When the spacing between elements in these orthogonal directions is approximately $\lambda/2$ or less as indicated in the drawing, the rectilinear array will exhibit a favorable grating lobe characteristic.

Figure 1C:
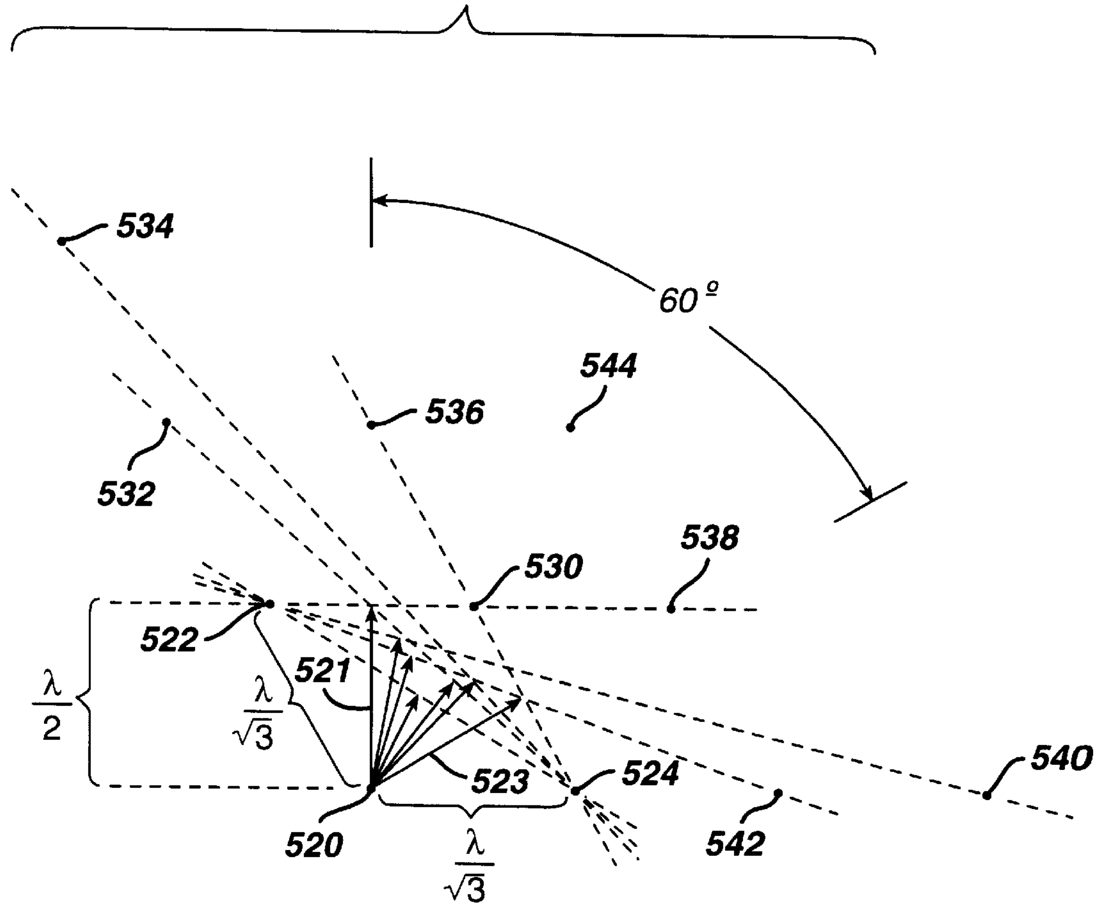

The pitch analysis for a hexagonal pattern of 10 transducer elements is shown in FIG. 1*c* for a reference element center 520. In this embodiment the transducer element centers are separated from neighboring element centers by a spacing of $$\frac{\lambda}{\sqrt{3}}.$$

Every point on the array surface in this embodiment is seen to be located in an equilateral triangle with an element center at the apex. One such triangle is formed by element centers 520, 530, 524 for instance, and another triangle is formed by element centers 520, 522, 530. It can be seen that the element centers in the bottom row of elements 520, 524, 542 are aligned with the elements of the row comprised of centers 532, 536, 544, whereas the element centers of the intermediate row 522, 530, 538 are staggered or offset from the adjacent rows. This alternating row pattern, which is seen to exist in both the row and (orthogonal) column directions, forms a triangular and a hexagonal pattern of elements. It is seen that a hexagonal pattern is formed by elements 520, 522, 536, 544, 538 and 524, for example.

The pitch analysis of this array is performed over a 60° arc azimuth from the reference element 520, since the pattern repeats six times over the full 360° arc of azimuth around the reference element. As in the previous analysis, dashed lines are drawn between the nearest neighbor element centers 522, 524 and other element centers which form rows with these elements such as 530, 532, 534, 540, and 542. Vectors designating pitch are then drawn normal to these dashed row lines from the reference element center. It is seen that the shortest vector and hence the shortest pitch is that between the element 520 and the row including the neighboring elements 522 and 524, which is at the center of the 60° arc of azimuth in this embodiment. On either side of this vector the vector lengths increase, reaching a maximum at vectors 521 and 523 at the 0° and 60° directions of the 60° arc of azimuth. These maximum vectors, and hence the maximum pitch of the array, have a length of $\lambda/2$. Even though the array has an interelement spacing of $$\frac{\lambda}{\sqrt{3}},$$

which is approximately 15% greater than $\lambda/2$, the maximum pitch of the array is $\lambda/2$. This means that the array of FIG.

1*c* can be more easily manufactured than the array of FIG. 1*b* due to its more relaxed element spacing, with the same grating lobe performance. It also means that the array of FIG. 1*c* can exhibit the same grating lobe performance of the FIG. 1*b* array with approximately 15% fewer transducer elements. It further means that 2D high frequency arrays (smaller λ values) can be more easily fabricated when a hexagonal element pattern is employed.

The tight packing made possible by the hexagonal shaped elements in FIG. 1 provides acceptable grating lobe performance. If the spacing between adjacent elements is approximately $$\frac{\lambda}{\sqrt{3}}$$

as shown bracket and arrow 33, the maximum array pitch in any direction is approximately λ/2 as shown by the brackets 31. Thus the requirement for the array pitch not to exceed λ/2 means that the element spacing within a row need only be λ/√3, or approximately 1.15 times λ/2. The criterion for acceptable grating lobe performance is satisfied in each instance, and the number of elements required to cover a given aperture has been reduced by about 15%. It will be appreciated that the λ/2 and λ/√3 criteria may be marginally exceeded in a given design or at the frequency limit of a transducer while still retaining the principal benefits of this invention, as the angle of the resultant grating lobes may still be sufficiently removed from the main lobe direction so as to be acceptable for a given range of steered beam inclination.

While the hexagonal array 10 of FIG. 1 can provide highly satisfactory 3D scanning, particularly when expanded to a significant number of array elements such as 3000 elements, the array provides a significant manufacturing challenge. It may be seen from FIG. 1 that the pattern of cuts 30 necessary to divide the initial stack into individual hexagonal elements is an intricate pattern of small cuts which constantly changes direction across the array. In particular, there is no straight line cut across the array, as there is with a 2D array of rectilinear elements. Consequently the stack must be diced by a process capable of affording this intricacy, such as chemical etching or laser ablation. However, such processes are time consuming and expensive, and hence not well suited to production of large quantities of arrays at reasonable cost. It is therefore desirable to provide a hexagonal array which can be diced by a diamond bladed circular saw, which is a well proven process for dicing ceramic piezoelectric materials quickly, accurately, and at reasonable cost. Dicing saws are, however, limited to straight line cuts.

Figure 2:
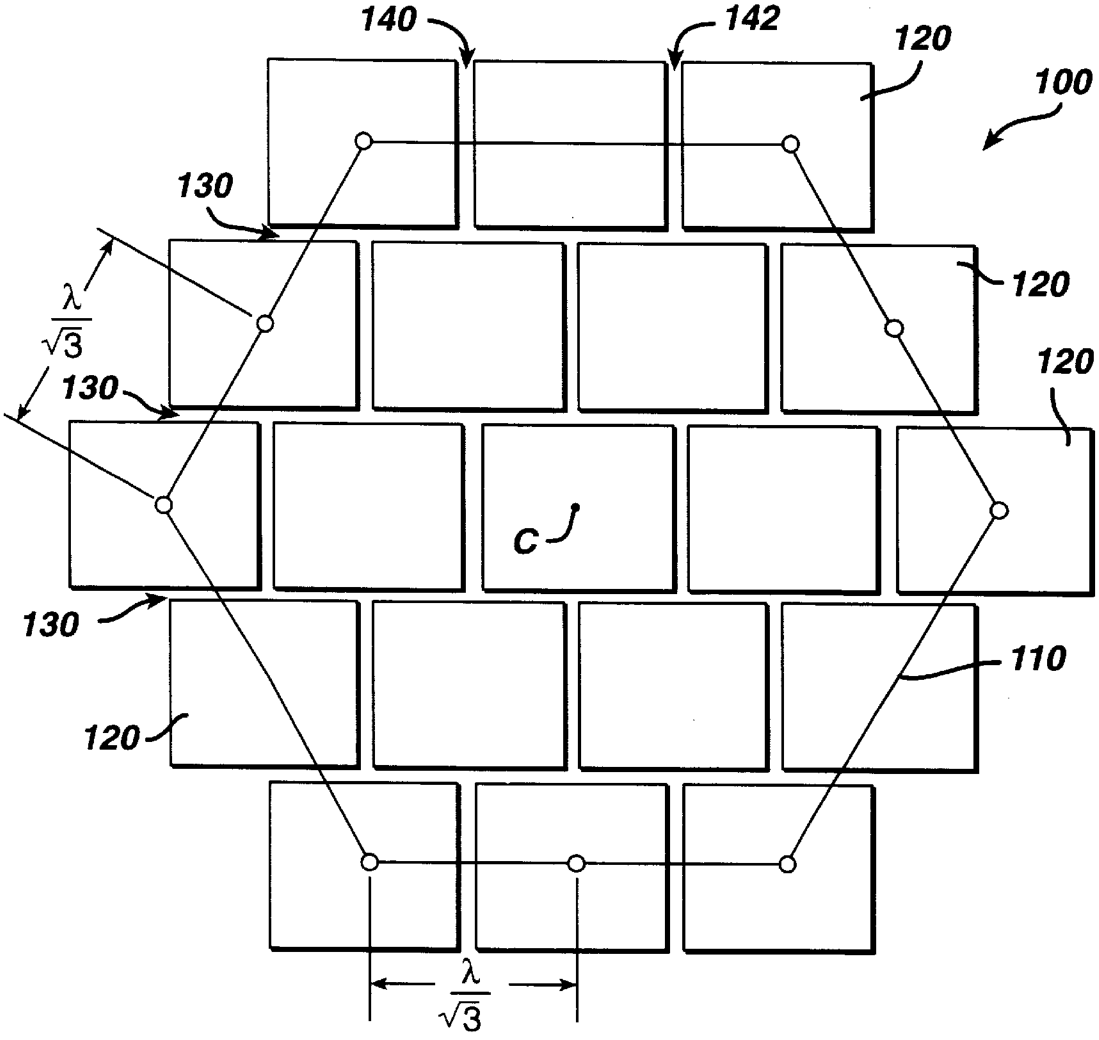

An embodiment of the present invention which addresses this problem is shown in FIG. 2. This drawing shows a transducer array 100 in plan view which comprises a plurality of rectilinear transducer elements 120 packed in a hexagonal array configuration, as indicated by the hexagonal pattern 110 connecting the peripheral elements of the array. This embodiment takes cognizance of the characteristic that when the greatest dimension of 2D phased array transducer elements is on the order of λ/2, the physics of diffraction causes the elements to behave identically from a functional standpoint, regardless of shape. When the elements 120 of the array 100 have a maximum center to center spacing which is no greater than approximately λ/√3, the above size criterion is satisfied and the substitution of rectilinear elements for hexagonal elements makes no significant functional difference in array performance. As before, the pitch in all azimuthal directions remains of consequence and must be taken into consideration if adequate grating lobe performance is to be maintained. Thus the embodiment of FIG. 2 will perform substantially the same as that of FIG. 1 when the other relevant criteria such as pitch and number of elements are comparable. In operation the hexagonal array 100 of FIG. 2 can steer beams from a center point C of the array over the full range of azimuthal directions, as well as from other points on the surface of the array as was the case of the first embodiment.

The embodiment of FIG. 2 only solves half of the fabrication problem, however. It may be seen that the dicing cuts 130 which separate the rows of elements extend completely across the array and hence can be fabricated with a dicing saw. The cuts or kerfs separating each row into individual elements are staggered from row to row, however, and cannot be formed by a dicing saw cutting a straight line across the array.

Figure 3A:
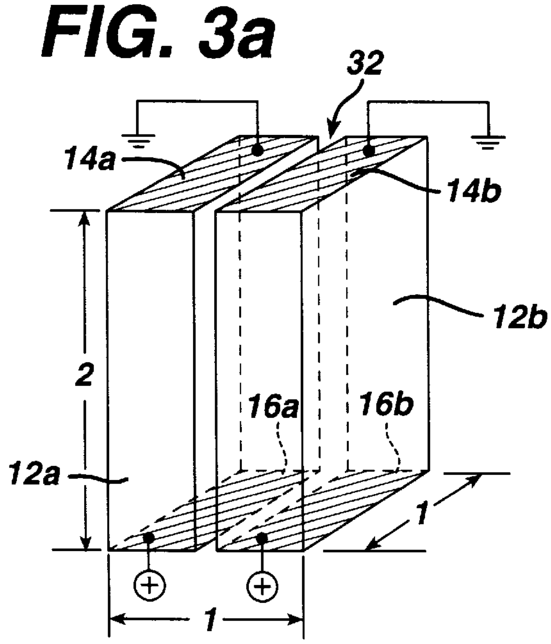

This dilemma is overcome by recognizing that a transducer element can be formed from two or more diced subelements which are electrically connected to function as a unitary array element. FIG. 3*a* shows such an element 220 formed by two subelements 12*a* and 12*b* separated by a kerf cut 32, which may be air-filled or filled with a stabilizing filler such as epoxy. Each subelement has one electrode 14*a*, 14*b* on its top surface and another electrode 16*a*, 16*b* on its bottom surface. (Matching layers are not illustrated in this drawing, but may also be present.) When the upper and lower electrodes are connected together, as indicated by the ground symbols on the top electrodes 14*a*, 14*b* and the + symbols on the bottom electrodes 16*a*, 16*b*, the subelements 12*a*, 12*b* will function together as a single transducer element.

Figure 4:
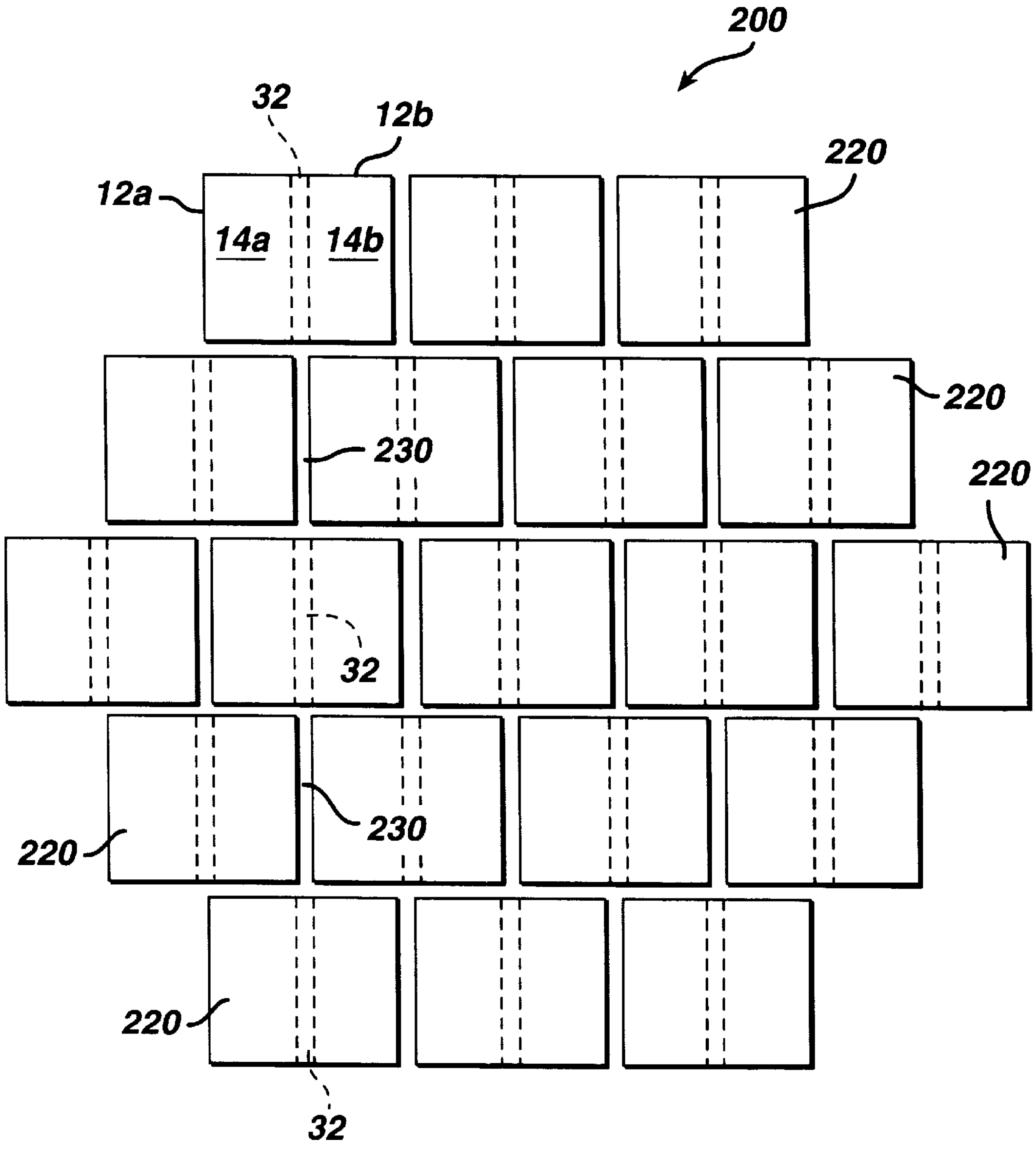
FIG. 4 is a plan view of subdiced rectilinear transducer elements arranged in a 2D hexagonal array.

A 2D hexagonal array 200 of subdiced transducer elements 220 is shown in a plan view in FIG. 4. In this configuration the subdicing kerfs 32 of one row are in line with the interelement cuts 230 which separate individual elements in the adjacent rows. Thus, a single line cut can be made across the array (vertically in the drawing), with the dashed portions of the cut serving as subdicing kerf cuts 32 and other interleaved solid-line portions serving as interelement cuts 230. The entire hexagonal array 200 can therefore be formed from a single piezoelectric stack with a dicing saw forming orthogonal cuts across the stack.

Figure 3B:
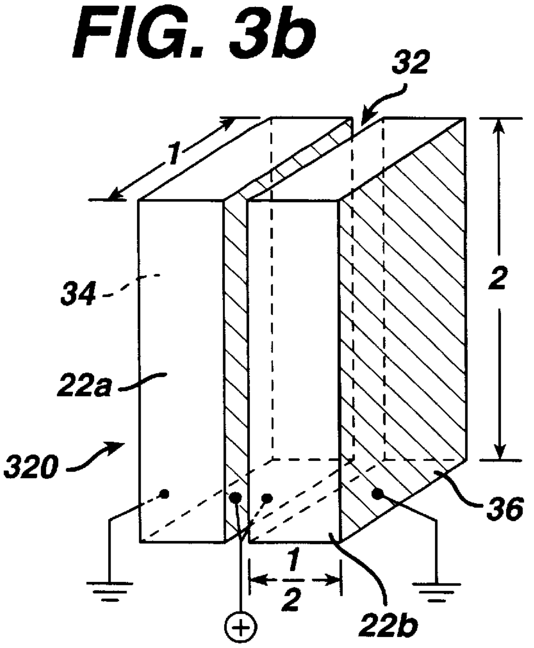

U.S. patent application Ser. No. 09/457,196 entitled COMPOSITE ULTRASONIC TRANSDUCER ARRAY OPERATING IN THE $k_{31}$ MODE of which I am a co-inventor describes 2D arrays operating in the $k_{31}$ mode of excitation. An advantage of these 2D arrays is that all necessary electrical connections to the two dimensional array of elements can be made at the bottom (backing or non-emitting side) of the array. FIG. 3*b* illustrates one such transducer element 320. Like the element 220 of FIG. 3*a*, element 320 comprises two subelements 22*a* and 22*b*. But unlike element 220 in which the subelements are poled vertically, the subelements of element 320 are poled horizontally by electrodes located on the sides (rather than the top and bottom) of the subelements. Electrodes for one polarity (+) of the energizing potential are located on the interior sides of the subelements which oppose each other in kerf 32, and electrodes 34, 36 for the other polarity (ground) are located on the outer sides of the subelements. The piezoelectric subelements are thus energized horizontally for transmission of ultrasound in the vertical orientation, the $k_{31}$ mode of operation. As explained in the Ser. No. 09/457,196 application, the electrodes preferably are formed by a conductive filler such as a conductive epoxy material. Each element thereby comprises a 2—2 composite matrix of piezoelectric material and a binder.

Figure 3C:
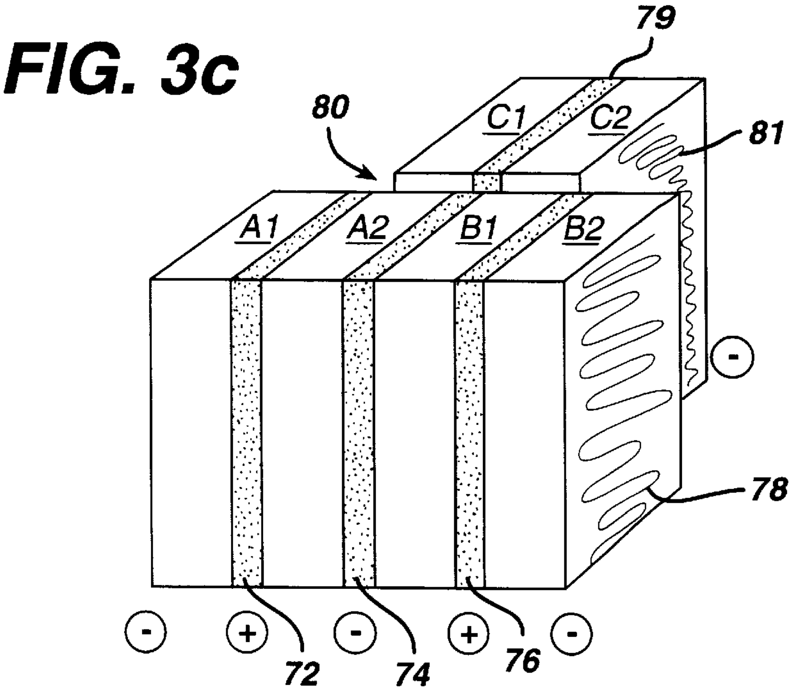

The $k_{31}$ composite element 320 of FIG. 3*b* may be used in a 2D array as illustrated in FIG. 3*c*. The row of elements nearest the viewer shows two elements of the row, one comprising subelements A1 and A2, and the other comprising subelements B1 and B2. The kerfs 72, 74, 76 between this series of subelements are filled with a conductive filler for the electrodes of the elements. As the polarity symbols below this front row show, the kerf electrodes alternate in polarity along the row. The electrode material in kerf 72 is the positive energizing electrode for the transducer element formed by subelements A1 and A2, and the electrode material in kerf 76 is the positive energizing electrode for the transducer element formed by subelements B1 and B2. The electrode material in kerf 74 forms one of the negative polarity or ground electrodes for both of these elements. The other ground electrodes for the two elements are provided by the electrode material 78 on the right side of subelement B2 and the electrode material on the left side of subelement A1 (not visible in this drawing).

Only one transducer element is shown in the row of elements behind the front row. This element comprises subelements C1 and C2. The elements of the second row are staggered in position with respect to the adjacent rows, with subelement C1 aligned with subelement A2 and subelement C2 aligned with subelement B1. As will be seen, this staggered alignment enables the elements to be oriented in a hexagonal array pattern. A consequence of this staggering is that the positive electrode material in center kerf 79 of the C1–C2 element is aligned with the negative or ground potential electrode material of kerf 74 in the adjacent row. The same is true at other kerfs along each row; it is seen, for example, that the negative or ground potential electrode material 81 of the C1–C2 element is aligned with the positive electrode kerf 76 of the adjacent row. As a result, kerf 80 provides electrical isolation between the two rows, and is air-filled or filled with a nonconductive filler.

Figure 5:
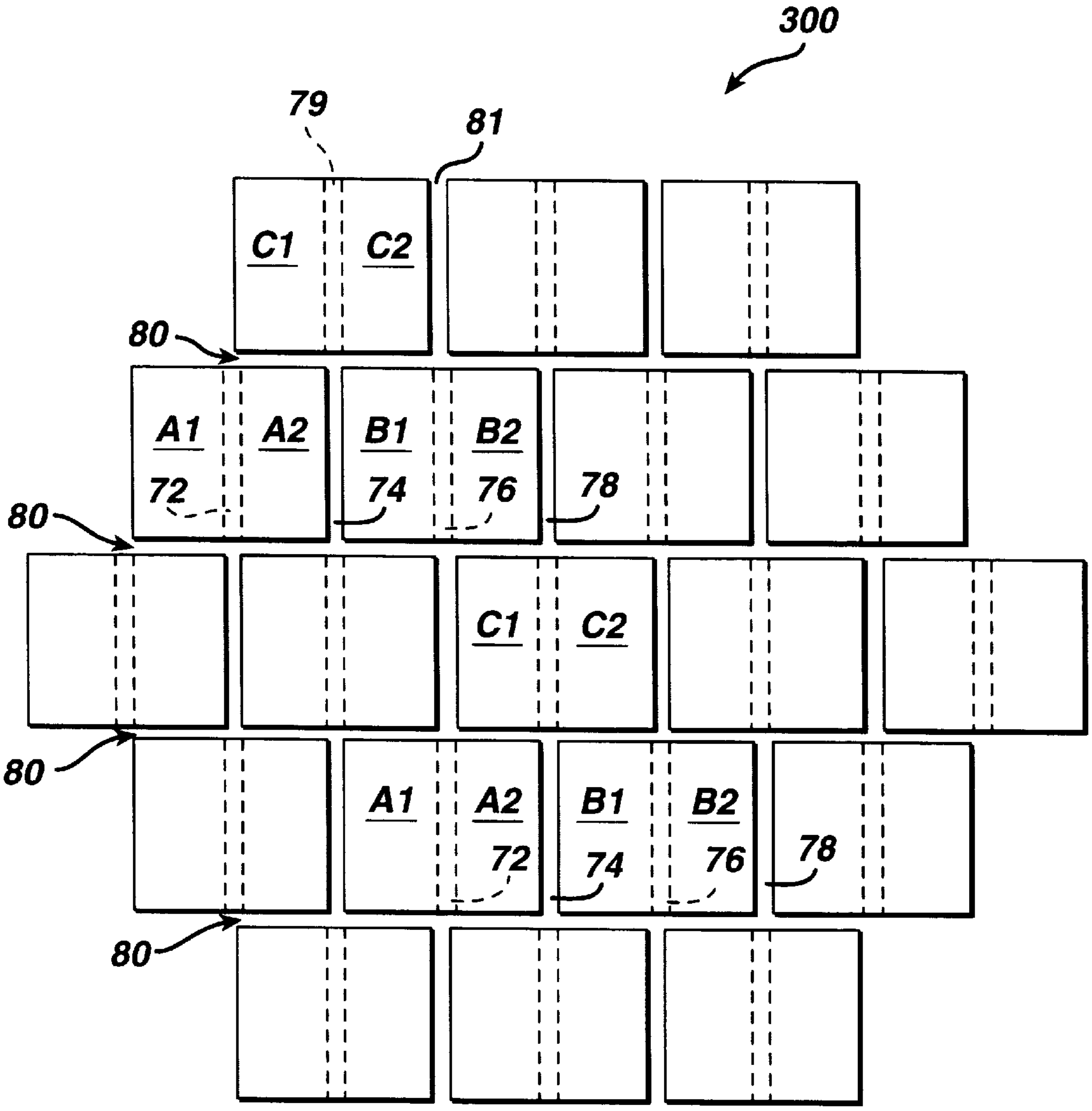
FIG. 5 is a plan view of composite rectilinear transducer elements arranged in a 2D hexagonal array.

FIG. 5 illustrates in plan view a hexagonal array using the $k_{31}$ composite elements of FIG. 3*c* in the alignment shown in that drawing. The sequence of A, B, and C elements is drawn at several locations in array 300 to illustrate the repeating nature of the sequence. The electrical connections for all of the elements of the array can be made from the back (backing or nontransmitting) side of the array by conductors aligned with each kerf in each row of elements. As just mentioned, the alternating polarity sequence of a row is staggered with respect to the sequence of each adjacent row. For example, the kerf electrodes of the top row have a left to right polarity sequence of +–+–+ starting with kerf 79. The aligned kerfs of the second row have a left to right polarity sequence of –+–+– starting with kerf 74. Kerf 80 provides electrical isolation between the electrodes of each row of elements.

The hexagonal array 300 can be readily manufactured using the dicing saw process. In a preferred process a piezoelectric stack of PZT with matching layers is affixed to a block of backing material containing electrical conductors. Preferably the backing block conductors comprise embedded flex circuit having conductors positioned in alignment with the intended locations of the transducer element electrodes as described in U.S. Pat. No. 6,043,590. The attached backing block provides stability to the transducer array as the elements are diced. In the embodiment of FIG. 5, all of the kerfs in the vertical direction are cut first, then filled with a conductive filler or adhesive such as a conductive epoxy. This conductive filler provides the electrode material for the electrodes in kerfs 72, 74, 76, 78, 79, 81. Then the orthogonal kerfs 80 are cut to electrically isolate the electrodes of each row from the electrodes of the adjacent rows. These kerfs 80 separate electrodes 79 from electrodes 74 and 78; and electrodes 81 from electrodes 76, for instance. The kerfs 80 may be left air-filled or may be filled with an electrically nonconductive filler to give further stability to the array.

In another embodiment, a plate of conductively filled 2—2 composite piezoelectric material may be used to fabricate the array, in with case only the horizontal kerfs 80 need be cut after the array is bonded together.

In yet another embodiment, all of the kerfs in both orthogonal directions are cut, then all kerfs are filled with the conductive filler. The filler is then removed from kerfs 80 where electrical isolation is desired by a process such as laser ablation.

Figure 6:
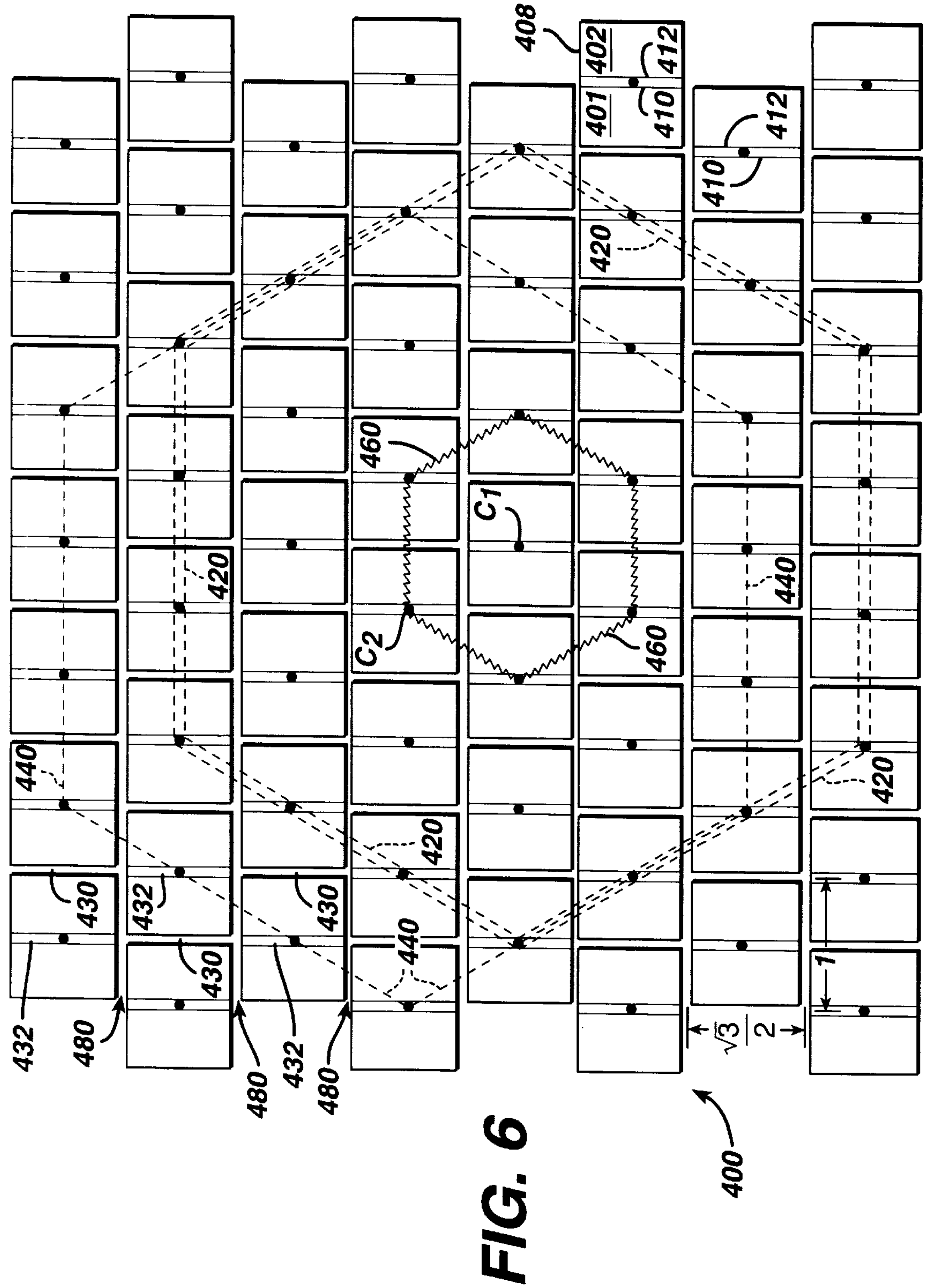
FIG. 6 is a plan view of a constructed embodiment of a close packed 2D hexagonal array.

The pattern of a constructed embodiment of the present invention is shown in FIG. 6 in a plan view. This drawing shows a rectilinear pattern of transducer elements which may be actuated in hexagonal groups of elements. The fine vertical lines on the drawing, some of which are designated as 410–412, represent dicing saw cuts between two subelements such as 401, 402. The heavy line boxes such as that indicated at 408 indicate a complete array element. Each element of the array 400 consists of two subelements electrically connected together. Element 408 consists of subelements 401 and 402, for instance. In the embodiment of FIG. 6 the cut spacing in one direction is $\sqrt{3}/2$ of the spacing in the other orthogonal direction in order to cause the centroids of the elements, indicated by the solid circles, to be hexagonally close packed. That is the ratio of the kerf spacings in the two orthogonal directions is $\sqrt{3}/2$ to 1, as shown in the lower left corner of the drawing. The elements of the array 400 may be operated in the conventional $k_{33}$ mode with electrodes located at the top and bottom of each piezoelectric element. Preferably the elements are operated in the $k_{31}$ mode as described above so that all electrical connections can be made at the bottom from the electrodes embedded in the backing block. For $k_{31}$ operation the vertical cuts 430, 432 in FIG. 6 are filled with conductive material to provide the electrodes of the elements, and the horizontal cuts 480 are air-filled or filled with a nonconductive material.

The embodiment of FIG. 6 provides several advantages besides that of ease of fabrication. Since the array comprises several thousand elements in the constructed embodiment, different numbers of adjacent transducer elements can be operated together to provide hexagonal groups of different sizes and hence different apertures. One such group is designated by the centroid-connecting wavy lines 460 and consists of only seven elements. Another group is designated by the centroid-connecting double dashed lines 420 and consists of 37 elements. In the constructed embodiment hexagonal groupings of up to practically the full size of the array can be formed. Transmit beams are steered and focused by the phased timing of actuation signals applied to the elements of the group. To transmit a beam which is steered to the right, for example, the elements of the group are progressively actuated from left to right. To transmit a beam straight ahead, that is, normal to and originating at the center of the group, the elements are actuated starting from the outer elements and progressing toward the center of the group.

Another advantage of the embodiment of FIG. 6 is that the hexagonal groupings can be positioned at different locations. The group designated by double dashed lines 420 is centered around centroid $C_1$ and can steer beams over the full range of azimuth directions about an axis extending normal to centroid $C_1$. A second hexagonal group, also consisting of 37 elements, is designated by the single dashed lines 440 and can steer beams around the axis extending from its centroid $C_2$. This means that when each group is operated with the same set of beam steering parameters they can each scan a volume of the same size but at a different location. Given a close proximity of the two groups as shown in FIG. 6 and a sufficient breadth of beam inclination angles relative to the array surface, the two scanned volumes can be overlapping. Points in the common volumetric region are thus scanned by a beam from each group which has a different beam steering angle, giving rise to the ability to do three dimensional spatial compounding when the echoes received by each group from the same point are combined. Other common imaging modes such as Doppler colorflow, harmonic imaging, and multiline scanning may also be performed in three dimensions with this embodiment. The array may also be curved in one or both dimensions as are linear curved arrays, or convexly or concavely formed.

It will be appreciated that array elements may be arranged into other polygonal patterns of greater than six sides, such as octagons or dodecagons. These shapes may, however, provide less uniform array area coverage and less uniform pitch over the full 360° of beam transmission azimuth. The hexagonal pattern is the preferred pattern because it minimizes the pitch afforded by a given fineness of construction detail, permitting use of the hexagonal array at relatively high frequencies of operation.

What is claimed is:

1. An ultrasonic array transducer for scanning three dimensional volumes comprising:

a two dimensional array of a plurality of rows of rectilinear transducer elements, wherein odd-numbered rows are aligned with each other, even-numbered rows are aligned with each other, and adjacent rows are offset from each other, wherein said transducer elements are operated in the $k_{31}$ mode, and wherein said transducer elements include electrodes formed on one or more sides of said elements which extend substantially from a top emitting surface of the element to a bottom surface of the element.

2. An ultrasonic array transducer for scanning three dimensional volumes comprising:

a two dimensional array of a plurality of rows of rectilinear transducer elements, wherein odd-numbered rows are aligned with each other, even-numbered rows are aligned with each other, and adjacent rows are offset from each other, wherein said elements are separated by kerf cuts, and wherein the cut spacing in one direction is approximately $\sqrt{3}/2$ of the cut spacing in the orthogonal direction.

3. An ultrasonic array transducer for scanning three dimensional volumes comprising:

a two dimensional array of a plurality of rows of rectilinear transducer elements, wherein odd-numbered rows are aligned with each ether, even-numbered rows are aligned with each other, and adjacent rows are offset from each other, wherein said elements are separated by kerf cuts, wherein said kerf cuts comprise straight line kerf cuts extending across said array in two orthogonal directions, and wherein the kerf cuts extending in one of said two directions are filled with an electrically conductive material, and wherein the kerf cuts extending in the other of said two directions are filled with an electrically nonconductive material.

4. An ultrasonic array transducer for scanning three dimensional volumes comprising:

a two dimensional array of a plurality of rows of rectilinear transducer elements, wherein odd-numbered rows are aligned with each other, even-numbered rows are aligned with each other, and adjacent rows are offset from each other, wherein each of said elements is formed of at least two subelements.

5. An ultrasonic array transducer for scanning three dimensional volumes comprising:

a two dimensional array of a plurality of rows of rectilinear transducer elements, wherein odd-numbered rows are aligned with each other, even-numbered rows are aligned with each other, and adjacent rows are offset from each other, wherein said transducer elements are operated in the $k_{31}$ mode, and wherein said transducer elements include electrodes formed of a conductive filler material located in one or more kerfs of said array.

6. A two dimensional ultrasonic array transducer comprising:

a plurality of rectilinear ultrasonic transducer elements extending in at least two dimensions which define a transmitting surface, said elements being separately actuateable in said at least two dimensions, and wherein said elements are organized as a hexagonal packing of elements, wherein said transducer elements are operated in the $k_{31}$ mode, and wherein said transducer elements include electrodes formed of a conductive filler material located in one or more kerfs of said array.

7. The ultrasonic array transducer of claim 6 or 5, wherein said conductive filler material comprises a conductive adhesive.

8. The ultrasonic array transducer of claim 6 or 5, wherein said conductive adhesive comprises a conductive epoxy.

9. A two dimensional ultrasonic array transducer comprising:

a plurality of rectilinear ultrasonic transducer elements extending in at least two dimensions which define a transmitting surface, said elements being separately actuateable in said at least two dimensions, and wherein said elements are organized as a hexagonal packing of elements, wherein each of said elements is formed of at least two subelements.

10. The ultrasonic array transducer of claim 9 or 4, wherein said subelements are joined by a filler material to form a composite transducer element.

11. The ultrasonic array transducer of claim 10, wherein said filler material comprises a conductive material providing at least one electrode of said transducer element.

12. A two dimensional ultrasonic array transducer comprising:

a plurality of rectilinear ultrasonic transducer elements extending in at least two dimensions which define a transmitting surface, said elements being separately actuateable in said at least two dimensions, and wherein said elements are organized as a hexagonal packing of elements, wherein said transducer elements are operated in the $k_{31}$ mode, wherein said transducer elements include electrodes formed on one or more sides of said elements which extend substantially from a top emitting surface of the element to a bottom surface of the element.

13. A two dimensional ultrasonic array transducer comprising:

a plurality of rectilinear ultrasonic transducer elements extending in at least two dimensions which define a transmitting surface, said elements being separately actuateable in said at least two dimensions, and wherein said elements are organized as a hexagonal packing of elements, wherein said elements are separated by kerf cuts, and wherein the cut spacing in one direction is approximately $\sqrt{3}/2$ of the cut spacing in the orthogonal direction.

14. A two dimensional ultrasonic array transducer comprising:

a plurality of rectilinear ultrasonic transducer elements extending in at least two dimensions which define a transmitting surface, said elements being separately actuateable in said at least two dimensions, and wherein said elements are organized as a hexagonal packing of elements, wherein said elements are separated by kerf cuts, wherein said kerf cuts comprise straight line kerf cuts extending across said array in two orthogonal directions, and wherein the kerf cuts extending in one of said two directions are filled with an electrically conductive material, and wherein the kerf cuts extending in the other of said two directions are filled with an electrically nonconductive material.

15. The ultrasonic array transducer of claim 14 or 3, wherein said nonconductive material comprises air.

16. The ultrasonic array transducer of claim 14 or 3, wherein said conductive material comprises an electrically conductive adhesive.

17. The ultrasonic array transducer of claim 16, wherein said conductive adhesive comprises an electrically conductive epoxy.

18. An ultrasonic array transducer for scanning a three dimensional volume comprising:

an array of piezoelectric transducer elements operating in the $k_{31}$ mode and extending in at least two dimensions, ones of said elements being individually actuateable and forming a polygonal transducer aperture of six or more sides, wherein said transducer elements are formed of two or more subdiced elements.

19. A two dimensional ultrasonic array transducer comprising a plurality of rows of rectilinear transducer elements, the transducer elements in each row being staggered in position with respect to the transducer elements in adjacent rows, with the centers of two elements in one row and the center of an adjacent element in an adjacent row forming a plurality of triangles extending in said two dimensions, wherein said triangles are equilateral triangles.

20. The two dimensional ultrasonic array transducer of claim 19, wherein the elements of said array exhibit an interelement spacing which is not greater than approximately $\lambda/\sqrt{3}$.

21. A two dimensional ultrasonic array transducer comprising a plurality of transducer elements extending in at least two dimensions which define an array aperture, said elements exhibiting a maximum pitch which is not greater than approximately $\lambda/2$ and a maximum interelement spacing which is not greater than approximately $\lambda/\sqrt{3}$.

22. The two dimensional ultrasonic array transducer of claim 21, wherein said transducer elements are organized in one or more hexagonal patterns.

23. The two dimensional ultrasonic array transducer of claim 21, wherein said element centers define a repeating pattern of adjacent equilateral triangles.

24. The two dimensional ultrasonic array transducer of claim 22 or 23, wherein said array elements exhibit a rectilinear shape.

25. The two dimensional ultrasonic array transducer of claim 22 or 23, wherein said maximum interelement spacing is greater than $\lambda/2$.

* * * * *